(12) United States Patent
Kim et al.

(10) Patent No.: US 9,275,993 B2
(45) Date of Patent: Mar. 1, 2016

(54) SEMICONDUCTOR DEVICE AND METHOD FOR FABRICATING THE SAME

(71) Applicant: Samsung Electronics Co., Ltd., Suwon-Si, Gyeonggi-Do (KR)

(72) Inventors: Weon-Hong Kim, Suwon-si (KR); Moon-Kyun Song, Anyang-si (KR); Seok-Jun Won, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/960,977

(22) Filed: Aug. 7, 2013

(65) Prior Publication Data

US 2014/0070325 A1  Mar. 13, 2014

(30) Foreign Application Priority Data

Sep. 7, 2012  (KR) .......... 10-2012-0099363

(51) Int. Cl.

| | | |
|---|---|---|
| *H01L 27/088* | (2006.01) | |
| *H01L 21/28* | (2006.01) | |
| *H01L 27/092* | (2006.01) | |
| *H01L 29/49* | (2006.01) | |
| *H01L 29/51* | (2006.01) | |
| *H01L 29/78* | (2006.01) | |
| H01L 21/8238 | (2006.01) | |

(52) U.S. Cl.
CPC ........ *H01L 27/088* (2013.01); *H01L 21/28008* (2013.01); *H01L 21/823857* (2013.01); *H01L 27/092* (2013.01); *H01L 29/4966* (2013.01); *H01L 29/513* (2013.01); *H01L 29/517* (2013.01); *H01L 29/78* (2013.01); *H01L 21/823807* (2013.01)

(58) Field of Classification Search
CPC ................. H01L 21/28008; H01L 21/823857; H01L 21/823807; H01L 27/088; H01L 27/092; H01L 29/4966; H01L 29/513; H01L 29/517; H01L 29/78
See application file for complete search history.

(56) References Cited

U.S. PATENT DOCUMENTS

| | | |
|---|---|---|
| 6,465,334 B1 | 10/2002 | Buynoski et al. |
| 6,767,795 B2 | 7/2004 | Ahn et al. |
| 6,818,517 B1 | 11/2004 | Maes |
| 6,825,106 B1 | 11/2004 | Gao et al. |
| 6,974,779 B2 | 12/2005 | O'Meara et al. |
| 7,018,902 B2 | 3/2006 | Visokay et al. |
| 7,060,571 B1 | 6/2006 | Ngo et al. |
| 7,067,434 B2 | 6/2006 | Colombo et al. |
| 7,205,620 B2 | 4/2007 | Ahn et al. |
| 7,208,361 B2 | 4/2007 | Shah et al. |
| 7,393,736 B2 | 7/2008 | Ahn et al. |
| 7,419,918 B2 | 9/2008 | Kim et al. |

(Continued)

FOREIGN PATENT DOCUMENTS

| | | |
|---|---|---|
| JP | 2005-064052 A | 3/2005 |
| JP | 2012-028713 A | 2/2012 |

(Continued)

*Primary Examiner* — Whitney T Moore
(74) *Attorney, Agent, or Firm* — Harness, Dickey & Pierce, P.L.C.

(57) ABSTRACT

A semiconductor device includes a first interface film on a first area of a substrate, the first interface film including a first growth interface film and a second growth interface film on a lower portion of the first growth interface film, a first dielectric film on the first interface film, and a first gate electrode on the first dielectric film.

8 Claims, 7 Drawing Sheets

(56) References Cited

U.S. PATENT DOCUMENTS

| | | |
|---|---|---|
| 7,745,278 B2 | 6/2010 | Bojarczuk, Jr. et al. |
| 7,902,018 B2 | 3/2011 | Kraus et al. |
| 7,910,488 B2 | 3/2011 | Gani et al. |
| 7,915,115 B2 | 3/2011 | Chudzik et al. |
| 7,943,462 B1 | 5/2011 | Beyer et al. |
| 8,026,161 B2 | 9/2011 | Ahn et al. |
| 8,120,144 B2 | 2/2012 | Chudzik et al. |
| 8,138,076 B2 | 3/2012 | Lin et al. |
| 2008/0026553 A1 | 1/2008 | Chua et al. |
| 2008/0146012 A1 | 6/2008 | Lin et al. |
| 2008/0303119 A1 | 12/2008 | Watanabe |
| 2009/0108296 A1* | 4/2009 | Karve et al. .................. 257/192 |
| 2010/0178744 A1 | 7/2010 | Takahashi et al. |
| 2010/0187644 A1 | 7/2010 | Nabatame |
| 2011/0312191 A1 | 12/2011 | Ohkura et al. |
| 2012/0021596 A1 | 1/2012 | Han et al. |
| 2014/0246732 A1* | 9/2014 | Chen et al. .................. 257/392 |

FOREIGN PATENT DOCUMENTS

| | | |
|---|---|---|
| KR | 2002-0011229 A | 2/2002 |
| KR | 2004-0107988 A | 12/2004 |
| KR | 2009-0011463 A | 2/2009 |

\* cited by examiner

SEMICONDUCTOR DEVICE AND METHOD FOR FABRICATING THE SAME

CROSS-REFERENCE TO RELATED APPLICATIONS

This application is based on and claims priority from Korean Patent Application No. 10-2012-0099363, filed on Sep. 7, 2012, in the Korean Intellectual Property Office, the disclosure of which is incorporated herein in its entirety by reference.

BACKGROUND

1. Field

Some example embodiments relate to a semiconductor device and a method for fabricating the same.

2. Description of the Prior Art

A semiconductor device may be classified into a semiconductor storage device and a semiconductor logic device. The semiconductor logic device may be, for example, an integrated circuit which includes MOS transistors, diodes, and the like, and performs a logic operation or an arithmetic operation. In general, both an NMOS transistor and a PMOS transistor are used as the MOS transistors, and skew may occur in electrical characteristics between the NMOS transistor and the PMOS transistor.

SUMMARY

Some example embodiments provide a semiconductor device having improved electrical characteristics. Other example embodiments provide a method for fabricating a semiconductor device having improved electrical characteristics.

According to an example embodiment, a semiconductor device includes a first interface film on a first area of a substrate, the first interface film including a first growth interface film and a second growth interface film on a lower portion of the first growth interface film, a first dielectric film on the first interface film, and a first gate electrode on the first dielectric film.

According to another example embodiment, a method for fabricating a semiconductor device includes defining a first area and a second area on a substrate, growing an interface material layer on the substrate, forming a dielectric material layer on the interface material layer, forming a first work function control material layer on the dielectric material layer in the second area of the substrate, forming a second work function control material layer on the dielectric material layer and the first work function control material layer, annealing the first work function control material layer and the second work function control material layer, removing the annealed first and second work function control material layers, and forming a re-growth interface material layer on a lower portion of the interface material layer in the first area of the substrate by re-growing the interface material layer in a direction of the substrate using an oxygen plasma process.

According to another example embodiment, a structure includes at least one first interface film on a first area of a substrate, the at least one first interface film having a first thickness, and a second interface film on a second area of the substrate, the second interface film having a second thickness greater than the first thickness, wherein a top surface of the at least one first interface film is formed at a same level as the second interface film.

According to another example embodiment, a semiconductor device includes a substrate including a first area and a second area, at least one interface film on the substrate, a first dielectric film on the at least one interface film in the first area of the substrate, the first dielectric film including lanthanum oxide (LaO), a second dielectric film on the at least one interface film in the second area of the substrate, the second dielectric film including aluminum oxide (AlO), and first and second gate electrodes on the first and second dielectric films, respectively.

Additional advantages and features of example embodiments will be set forth in part in the description which follows and in part will become apparent to those having ordinary skill in the art upon examination of the following or may be learned from practice of the example embodiments.

BRIEF DESCRIPTION OF THE DRAWINGS

The above and other features and advantages of example embodiments will be more apparent from the following detailed description taken in conjunction with the accompanying drawings, in which.

DETAILED DESCRIPTION OF THE EMBODIMENTS

Figure 1:
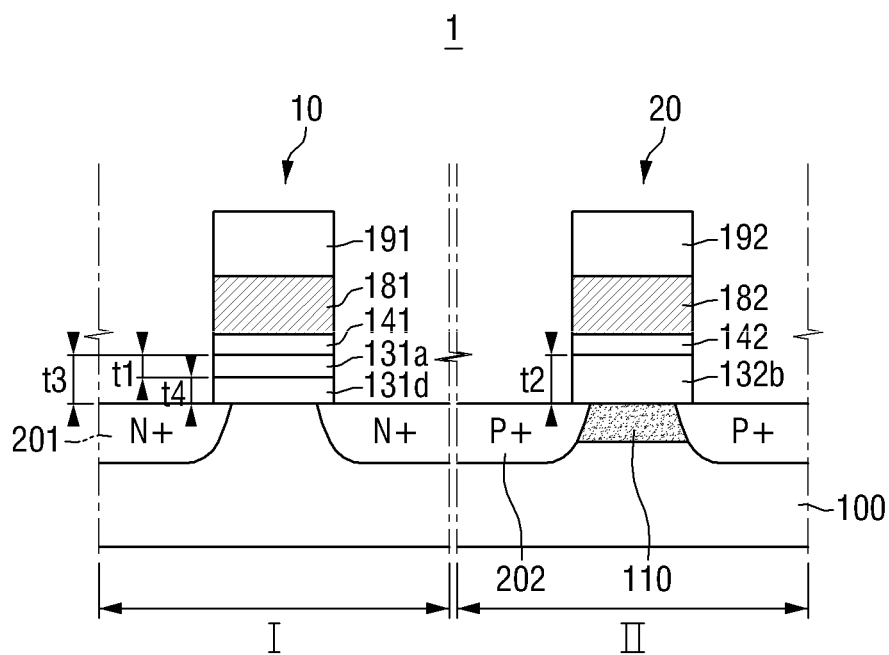
FIG. 1 is a schematic cross-sectional view of a semiconductor device according to an example embodiment.

The inventive concepts will now be described more fully hereinafter with reference to the accompanying drawings, in which example embodiments are shown. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or example terms provided herein is intended merely to better illuminate the inventive concepts and is not a limitation on the scope of the inventive concepts unless otherwise specified. Further, unless defined otherwise, all terms defined in generally used dictionaries may not be overly interpreted.

The inventive concepts will be described with reference to perspective views, cross-sectional views, and/or plan views, in which example embodiments are shown. Thus, the profile of an example view may be modified according to manufacturing techniques and/or allowances. That is, example embodiments are not intended to limit the scope of the inventive concepts but cover all changes and modifications that can be caused due to a change in manufacturing process. Thus, regions shown in the drawings are illustrated in schematic form and the shapes of the regions are presented simply by way of illustration and not as a limitation.

Hereinafter, with reference to FIG. 1, a semiconductor device according to an example embodiment will be described. FIG. 1 is a schematic cross-sectional view of a semiconductor device according to an example embodiment.

Referring to FIG. 1, on a substrate 100 of a semiconductor device 1 according to an example embodiment, a first area I and a second area II are defined.

The substrate 100 may be, for example, a rigid substrate, such as a substrate that is made of one or more semiconductor materials selected from the group consisting of Si, Ge, SiGe, GaP, GaAs, SiC, SiGeC, InAs, and InP, an SOI (Silicon On Insulator) substrate, a quartz substrate, or a glass substrate for display, or a flexible plastic substrate made of polyimide, PET (PolyEthylene Terephthalate), PEN (PolyEthylene Naphthalate), PMMA (PolyMethyl MethAcrylate), PC (PolyCarbonate), PES (PolyEtherSulfone), or polyester.

A first transistor 10 is formed in the first area I of the substrate 100, and a second transistor 20 is formed in the second area II of the substrate 100. Here, the first transistor 10 may be an NMOS transistor (n-channel MOSFET), and the second transistor 20 may be a PMOS transistor (p-channel MOSFET).

The first transistor 10 includes a first gate stack and first source/drain areas 201. Here, the first gate stack includes first interface films 131a and 131d, a first dielectric, i.e., high-k, film 141, first gate electrodes 191 and 181, and the like.

The first interface films 131a and 131d are interposed between the substrate 100 and the first dielectric, i.e., high-k, film 141 to prevent or reduce an inferior interface between the substrate 100 and the first dielectric, i.e., high-k, film 141. The first interface films 131a and 131d may be made of a low-k material having permittivity that is equal to or less than 9. The first interface films 131a and 131d may include, for example, a silicon oxynitride film. However, example embodiments are not limited thereto, but the first interface films 131a and 131d may be made of, for example, a silicon oxide film or a silicate film, or a combination thereof The first interface films 131a and 131d may be formed as a structure in which a first growth interface film 131a and a second growth interface film 131d are laminated. The second growth interface film 131d may be an interface film which is interposed between the substrate 100 and the first growth interface film 131a and is re-grown from the first growth interface film 131a. The first growth interface film 131a is formed with a first thickness t1, and the second growth interface film 131d is formed with a fourth thickness t4. The first thickness t1 may be relatively thinner than a thickness t2 of a second interface film 132b to be described later.

The first dielectric, i.e., high-k, film 141 is formed on the first interface films 131a and 131d. The first dielectric, i.e., high-k, film 141 may be a high-k material layer. The first dielectric, i.e., high-k, film 141 may include, for example, a material selected from the group consisting of $HfO_2$, $ZrO_2$, $Ta_2O_5$, $TiO_2$, $SrTiO_3$, or $(Ba, Sr)TiO_3$. The first dielectric, i.e., high-k, film 141 may be formed with a proper thickness depending on the material that is included therein.

The first gate electrodes 181 and 191 are formed on the first dielectric, i.e., high-k, film 141. The first gate electrodes 181 and 191 may be a laminate of a metal electrode and a silicon electrode, but are not limited thereto. The first metal electrode 181 may include, for example, TiN, and the first silicon electrode 191 may include, for example, amorphous silicon or poly silicon.

The first source/drain areas 201 are arranged on both sides of the first gate stack in the substrate 100. An n-type impurity may be injected onto the first source/drain areas 201. The n-type impurity may include, for example, indium (P), arsenic (As), antinomy (Sb), bismuth (Bi), or the like. A channel area of the first transistor 10 may be formed between a pair of the first source/drain areas 201.

The second transistor 20 includes a second gate stack and second source/drain areas 202. Here, the second gate stack includes a second interface film 132b, a second dielectric, i.e., high-k, film 142, second gate electrodes 182 and 192, and the like.

The second interface films 132b is interposed between the substrate 100 and the second dielectric, i.e., high-k, film 142 to prevent or reduce an inferior interface between the substrate 100 and the second dielectric, i.e., high-k, film 142. The second interface film 132 may be a low-k material layer, and may include, for example, a silicon oxynitride film. However, example embodiments are not limited thereto, but the second interface film 132b may be made of, for example, a silicon oxide film, a silicate film, or a combination thereof.

Unlike the first interface films 131a and 131d, the second interface film 132b is formed as a single layer. The second interface film 132b is formed with the second thickness t2.

As described above, the overall thickness t3 of the first interface films 131a and 131d may be thinner than the second thickness t2, but is not limited thereto. The overall thickness t3 may be variously controlled depending on the performance of the NMOS transistor 10 and the PMOS transistor 20. The upper surface of the first interface films 131a and 131d is formed at the same level as the upper surface of the second interface film 132b.

Accordingly, in the semiconductor device 1 according to an example embodiment, Tinv (inversion-layer thickness) of the NMOS transistor 10 is increased, and the Tinv skew between the NMOS transistor 10 and the PMOS transistor 20 is decreased. Further, without any change of Tinv of the PMOS transistor 20, gate leakage current Igon of the PMOS transistor 20 is decreased. Here, Tinv indicates an average position or centroid of inversion charge below the interface between the substrate and a gate insulating film in the transistor.

The second dielectric, i.e., high-k, film 142 is formed on the second interface film 132b. The second dielectric, i.e., high-k, film 142 may be a high-k material layer 140 that is substantially the same as the first dielectric, i.e., high-k, film 141. The second dielectric, i.e., high-k, film 142 may include, for example, a material selected from the group consisting of $HfO_2$, $SrTiO_3$, or $(Ba, Sr)TiO_3$. The second dielectric, i.e., high-k, film 142 may be formed with a proper thickness depending on the material that is included therein.

The second gate electrodes 182 and 192 are formed on the second dielectric, i.e., high-k, film 142. The second gate electrodes 182 and 192 may be a laminate of a metal electrode and a silicon electrode, which is substantially the same as the first gate electrodes, but are not limited thereto. The second metal electrode 182 may include, for example, TiN, and the second silicon electrode 192 may include, for example, amorphous silicon or poly silicon.

The second source/drain areas 202 are arranged on both sides of the second gate stack in the substrate 100. A p-type impurity may be injected into the second source/drain areas 202. The p-type impurity may include, for example, boron (B), aluminum (Al), indium (In), gallium (Ga), or the like. A channel area of the second transistor 20 may be formed between a pair of the second source/drain areas 202.

A channel layer 110 may be arranged in the channel area of the second transistor 20 in the second area II of the substrate 100. The channel layer 110 may include, for example, SiGe. The SiGe channel layer 110 may improve mobility of holes in the PMOS transistor. A Si cap layer (not shown) may be formed on an upper portion of the SiGe channel layer 110, and a Si buffer layer (not shown) may be formed on a lower portion of the SiGe channel layer 110.

Lanthanum oxide (LaO) may be included in the first dielectric, i.e., high-k, film 141 of the first transistor 10, but LaO may not be included in the second dielectric, i.e., high-k, film 142 of the second transistor 20. LaO serves to adjust the work function and the threshold voltage Vt of the first transistor 10. Further, aluminum oxide (AlO) may be included in the second dielectric, i.e., high-k, film 142 of the second transistor 20, but AlO may not be included in the first dielectric, i.e., high-k, film 141 of the first transistor 10. AlO serves to adjust the work function and the threshold voltage Vt of the second transistor 20. As a result, in the semiconductor device 1 according to an example embodiment, the operating characteristics of the first, i.e., NMOS, transistor 10 and the second, i.e., PMOS, transistor 20 may be improved.

Figure 2:
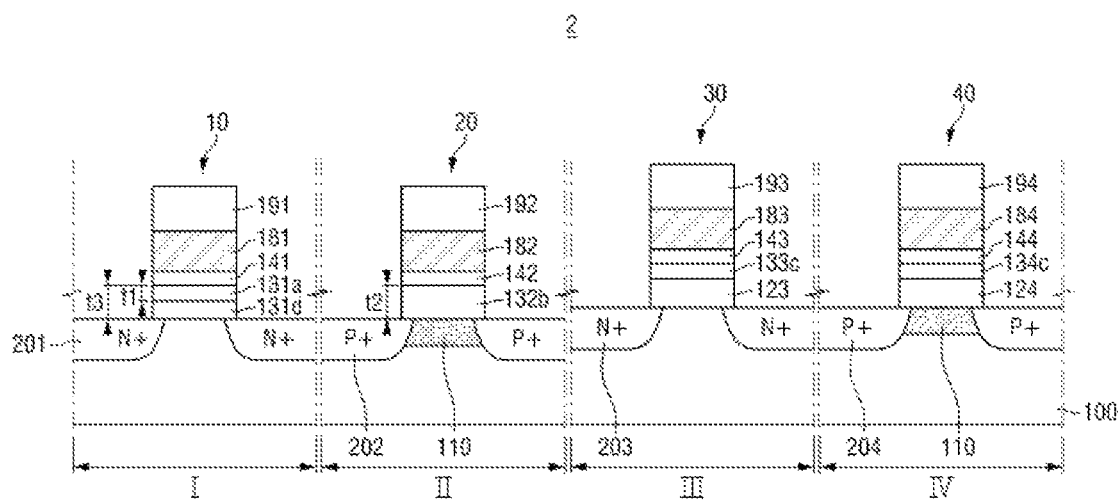
FIG. 2 is a schematic cross-sectional view of a semiconductor device according to another example embodiment.

Hereinafter, referring to FIG. 2, a semiconductor device according to another example embodiment will be described. FIG. 2 is a schematic cross-sectional view of a semiconductor device according to another example embodiment. For convenience in explanation, the explanation will be made around the point of difference from FIG. 1.

Referring to FIG. 2, on a substrate 100 of a semiconductor device 2 according to another example embodiment, first to fourth areas I to IV are defined.

The substrate 100 may be, for example, a rigid substrate, such as a substrate that is made of one or more semiconductor materials selected from the group consisting of Si, Ge, SiGe, GaP, GaAs, SiC, SiGeC, InAs, and InP, an SOI (Silicon On Insulator) substrate, a quartz substrate, or a glass substrate for display, or a flexible plastic substrate made of polyimide, PET (PolyEthylene Terephthalate), PEN (PolyEthylene Naphthalate), PMMA (PolyMethyl MethAcrylate), PC (PolyCarbonate), PES (PolyEtherSulfone), or polyester.

A first transistor 10 is formed in the first area I of the substrate 100, a second transistor 20 is formed in the second area II of the substrate 100, a third transistor 30 is formed in the third area III of the substrate 100, and a fourth transistor 40 is formed in the fourth area IV of the substrate 100. Here, the first transistor 10 and the third transistor 30 may be NMOS transistors (n-channel MOSFETs), and the second transistor 20 and the fourth transistor 40 may be PMOS transistors (p-channel MOSFETs).

The first transistor 10 and the second transistor 20 may be formed in substantially the same manner as the first transistor 10 and the second transistor 20 in FIG. 1, and the detailed description thereof will be omitted hereinafter.

The third transistor 30 includes a third gate stack and third source/drain areas 203. Here, the third gate stack includes a first insulating film 123, a third interface films 133c, a third dielectric, i.e., high-k, film 143, third gate electrodes 183 and 193, and the like.

The first insulating film 123 is formed in the third area III of the substrate 100. The first insulating film 123 may include, for example, a silicon oxide film, but is not limited thereto. The first insulating film 123 is formed to be relatively thicker than the first to fourth interface films 134c, 131a, 131d, 132b, 133c, and 134c.

The third interface film 133c is interposed between the first insulating film 123 and the third dielectric, i.e., high-k, film 143. The third interface film 133c may be made of a low-k material in substantially the same manner as the second interface film 132b. The third interface film 133c may include, for example, a silicon oxynitride film. However, example embodiments are not limited thereto, but the third interface film 133c may be made of for example, a silicon oxide film, a silicate film, or a combination thereof. The third interface film 133c may be formed as a single layer in substantially the same manner as the second interface film 132b, and may be formed with substantially the same thickness t1 as the first growth interface film 131a.

The third dielectric, i.e., high-k, film 143 is formed on the third interface film 133c. The third dielectric, i.e., high-k, film 143 may be a dielectric, i.e., high-k, material layer 140 in substantially the same manner as the first dielectric, i.e., high-k, film 141. The third dielectric, i.e., high-k, film 143 may include, for example, a material selected from the group consisting of $HfO_2$, $ZrO_2$, $Ta_2O_5$, $TiO_2$, $SrTiO_3$, or $(Ba, Sr)TiO_3$. The third dielectric, i.e., high-k, film 143 may be formed with a proper thickness depending on the material that is included therein.

The third gate electrodes 183 and 193 are formed on the third dielectric, i.e., high-k, film 143. The third gate electrodes 183 and 193 may be a laminate of a metal electrode and a silicon electrode in substantially the same manner as the first gate electrode, but are not limited thereto. The third metal electrode 183 may include, for example, TiN, and the third silicon electrode 193 may include, for example, amorphous silicon or poly silicon.

The third source/drain areas 123 are arranged on both sides of the third gate stack in the substrate 100. An n-type impurity may be injected into the third source/drain areas 123. The n-type impurity may include, for example, indium (P), arsenic (As), antinomy (Sb), bismuth (Bi), or the like. A channel area of the third transistor 30 may be formed between a pair of the third source/drain areas 123.

The fourth transistor 40 includes a fourth gate stack and fourth source/drain areas 204. Here, the fourth gate stack includes a second insulating film 124, a fourth interface film 134c, a fourth dielectric, i.e., high-k, film 144, fourth gate electrodes 184 and 194, and the like.

The second insulating film 124 is formed in the fourth area IV of the substrate 100. The second insulating film 124 may include a silicon oxide film in substantially the same manner as the first insulating film 123, but is not limited thereto. The second insulating film 124 is formed to be relatively thicker than the first to fourth interface films 131a, 131d, 132b, 133c, and 134c.

The fourth interface film 134c is interposed between the second insulating film 124 and the fourth dielectric, i.e., high-k, film 144. The fourth interface film 134c may be made of a low-k material in substantially the same manner as the second interface film 132b, and may include, for example, a silicon oxynitride film. However, example embodiments are not limited thereto, but the fourth interface film 134c may be made of, for example, a silicon oxide film, a silicate film, or a combination thereof. The fourth interface film 134c may be formed as a single layer in substantially the same manner as the second interface film 132b, and may be formed with substantially the same thickness U as the first growth interface film 131a.

The fourth dielectric, i.e., high-k, film 144 is formed on the fourth interface films 134c. The fourth dielectric, i.e., high-k, film 144 may be a high-k material layer in substantially the same manner as the first dielectric, i.e., high-k, film 141. The fourth dielectric, i.e., high-k, film 144 may include, for example, a material selected from the group consisting of $HfO_2$, $ZrO_2$, $Ta_2O_5$, $TiO_2$, $SrTiO_3$, or $(Ba, Sr)TiO_3$. The fourth dielectric, i.e., high-k, film 144 may be formed with a proper thickness depending on the material that is included therein.

The fourth gate electrodes 184 and 194 are formed on the fourth dielectric, i.e., high-k, film 144. The fourth gate electrodes 184 and 194 may be a laminate of a metal electrode and a silicon electrode in substantially the same manner as the first gate electrode, but are not limited thereto. The fourth metal electrode 184 may include, for example, TiN, and the fourth silicon electrode 194 may include, for example, amorphous silicon or poly silicon.

The fourth source/drain areas 204 are arranged on both sides of the fourth gate stack in the substrate 100. A p-type impurity may be injected into the fourth source/drain areas 204. The p-type impurity may include, for example, boron (B), aluminum (Al), indium (In), gallium (Ga), or the like. A channel area of the fourth transistor 40 may be formed between a pair of the fourth source/drain areas 204.

A channel layer 110 may be arranged in the channel area of the fourth transistor 40 in the fourth area IVI of the substrate 100. The channel layer 110 may include, for example, SiGe. The SiGe channel layer 110 may improve mobility of holes in the PMOS transistor. A Si cap layer (not shown) may be formed on an upper portion of the SiGe channel layer 110, and a Si buffer layer (not shown) may be formed on a lower portion of the SiGe channel layer 110.

Lanthanum oxide (LaO) may be included in the third dielectric, i.e., high-k, film 143 of the third transistor 30, but LaO may not be included in the fourth dielectric, i.e., high-k, film 144 of the fourth transistor 40. LaO serves to adjust the work function and the threshold voltage Vt of the third, i.e., NMOS, transistor 30. Further, aluminum oxide (AlO) may be included in the fourth dielectric, i.e., high-k, film 144 of the fourth transistor 40, but AlO may not be included in the third dielectric, i.e., high-k, film 143 of the fourth, i.e., PMOS, transistor 40. AlO serves to adjust the work function and the threshold voltage Vt of the PMOS transistor 40. As a result, in the semiconductor device 2 according to another example embodiment, the operating characteristics of the NMOS transistor 30 and the PMOS transistor 40 may be improved.

In the semiconductor device 2 according to another example embodiment, the first transistor 10 and the second transistor 20 may be SG transistors, and the third transistor 30 and the fourth transistor 40 may be EG transistors. Here, the SG transistor indicates a transistor for relatively low voltage having a relatively thin gate insulating film, and the EG transistor indicates a transistor for relatively high voltage having a relatively thick gate insulating film. Here, each of the first transistor 10 and the second transistor 20 has an interface film and a gate insulating film including a dielectric, i.e., high-k, film, and each of the third transistor 30 and the fourth transistor 40 has an insulating film, an interface film, and a gate insulating film including a dielectric, i.e., high-k, film. In the semiconductor logic device, the EG transistor may be used in, for example, an input/output module, and the SG transistor may be used in, for example, a logic module.

Hereinafter, referring to FIGS. 3 to 13, a method for fabricating a semiconductor device according to an example embodiment will be described. FIGS. 3 to 13 are cross-sectional views explaining intermediate steps of a method for fabricating the semiconductor device of FIG. 2. Since the method for fabricating a semiconductor device illustrated in FIG. 1 is apparent from the method for fabricating a semiconductor device according to an example embodiment to be described with reference to FIGS. 3 to 13, the detailed description thereof will be omitted.

Figure 3:
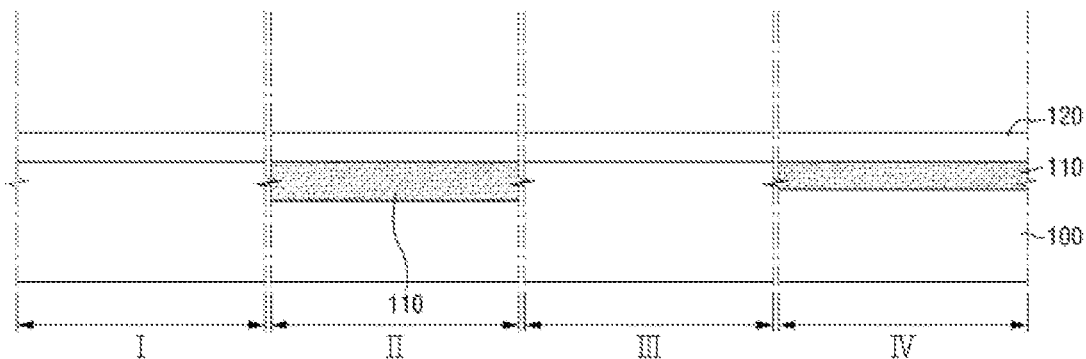
FIGS. 3 to 13 are cross-sectional views explaining intermediate steps of a method for fabricating the semiconductor device of FIG. 2.

Referring to FIG. 3, a substrate 100 is prepared. The substrate 100 may be a rigid substrate, such as a substrate that is made of one or more semiconductor materials selected from the group consisting of Si, Ge, SiGe, GaP, GaAs, SiC, SiGeC, InAs, and InP, an SOI substrate, a quartz substrate, or a glass substrate for display, or a flexible plastic substrate made of polyimide, PET, PEN, PMMA, PC, PES, or polyester.

A device isolation area (not illustrated) that defines an active area is formed on the substrate 100. At this time, the device isolation area may be formed of STI (Shallow Trench Isolation) or FOX (Field Oxide). The device isolation area may define active areas of a first area I, a second area II, a third area III, and a fourth area IV on the substrate 100.

Then, in order to improve mobility of holes, a channel layer 110 is formed in the second area II and the fourth area IV of the substrate 100. The channel layer 110 may be formed to include, for example, SiGe.

Then, an insulating material layer 120 for forming an insulating film is formed on the substrate 100. The insulating material layer 120 may be formed of, for example, a silicon oxide film, but is not limited thereto. At this time, the insulating material layer 120 is formed to be thicker than an interface material layer 130 to be described later. The insulating material layer 120 may be formed using, for example, CVD (Chemical Vapor Deposition), PECVD (Plasma Enhanced Chemical Vapor Deposition), or the like.

Figure 4:
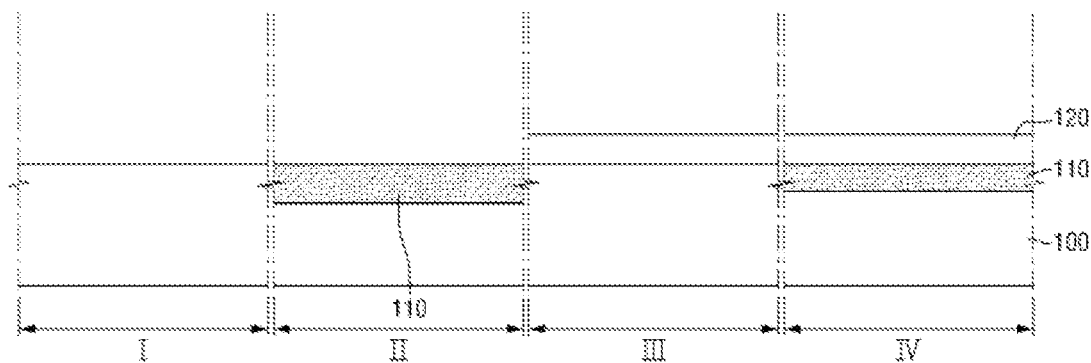

Referring to FIG. 4, a first mask film (not illustrated) is formed on the insulating material layer 120. The first mask film may include, for example, a silicon nitride film. A first mask pattern is formed by patterning the first mask film. At this time, the first and second areas I and II of the insulating material layer 120 are exposed by the first mask pattern. Then, an exposed area of the insulating material layer 120 is etched using the first mask pattern as an etching mask. Accordingly, the insulating material layer 120 is formed only on the third and fourth areas III and IV of the substrate 100, but is not formed on the first and second areas I and II of the substrate 100. An upper surface of the insulating material layer 120 is exposed by removing the first mask pattern that remains on the insulating material layer 120.

Figure 5:
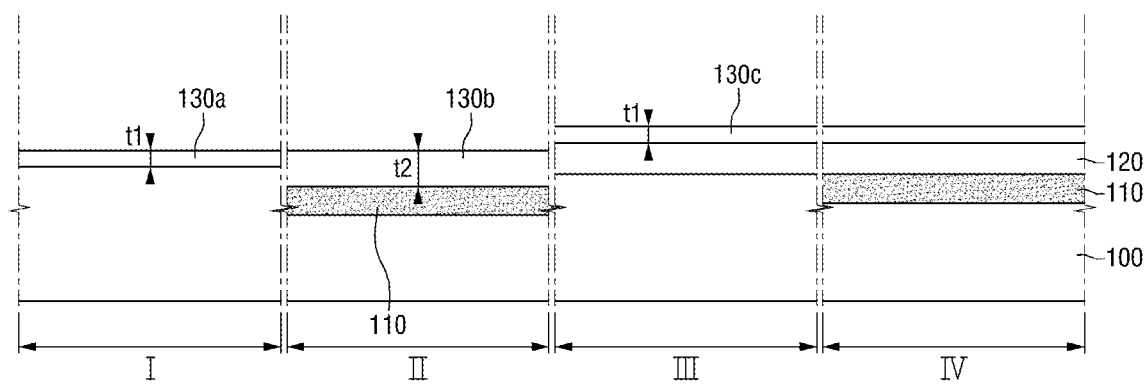

Referring to FIG. 5, interface material layers 130a, 130b, and 130c for forming interface films on the first, second, and third areas I, II and III of the substrate 100 and the insulating material layer 120 are conformally grown. The interface material layers 130a, 130b, and 130c may be formed of a silicon oxynitride film, a silicon oxide film, a silicate film, or a combination thereof. The interface material layers 130a, 130b, and 130c are formed of a single layer. The interface material layer 130a of the first area I is formed with a first thickness t1, and the interface material layer 130b of the second area II is formed with a second thickness t2. Since the channel layer 110 is arranged in the second area II of the substrate 100, the first thickness t1 may be relatively thinner than the second thickness t2. Since the insulating material layer 120 is formed on the third and fourth areas III and IV of the substrate 100, the interface material layer 130c of the third and fourth areas III and IV may be formed with the thickness t1 that is substantially the same as the thickness of the interface material layer 130a of the first area I.

Figure 6:
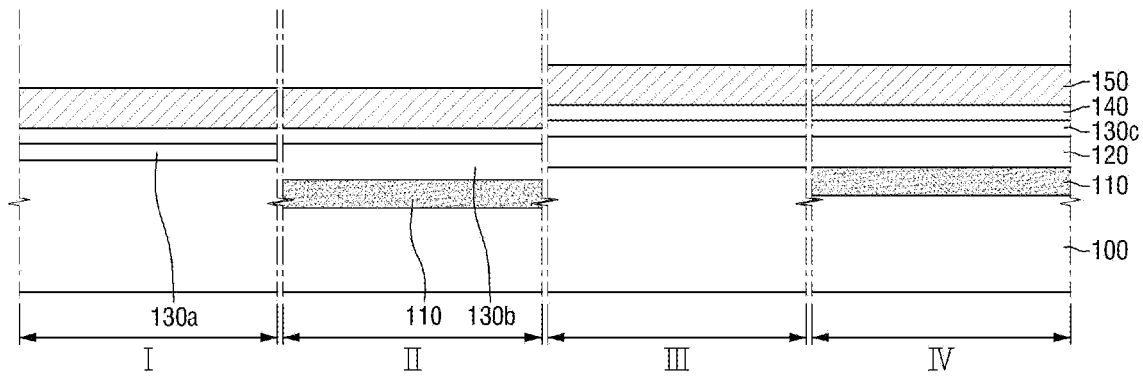

Referring to FIG. 6, a dielectric, i.e., high-k, material layer 140 for forming a dielectric, i.e., high-k, film on the interface material layers 130a, 130b, and 130c is conformally formed. The dielectric material layer 140 may be formed of, for example, a material, which is a high-k material, selected from the group consisting of $HfO_2$, $ZrO_2$, $Ta_2O_5$, $TiO_2$, $SrTiO_3$, or $(Ba, Sr)TiO_3$. The dielectric, i.e., high-k, material layer 140 may be formed with a proper thickness depending on the selected material.

A first work function control material layer 150 is conformally formed on the dielectric, i.e., high-k, material layer 140. The first work function control material layer 150 may include, for example, Al. More specifically, the first work function control material layer 150 may include a lower TiN film, an Al film, and an upper TiN film, which are sequentially laminated. Further, the first work function control material layer 150 may exclude the upper TiN film and include the Al film and the upper TiN film, which are sequentially laminated. The first work function control material is not limited to Al but may include, for example, at least one selected from the group consisting of Al, Ti, Zr, Hf, and Mg.

Figure 7:
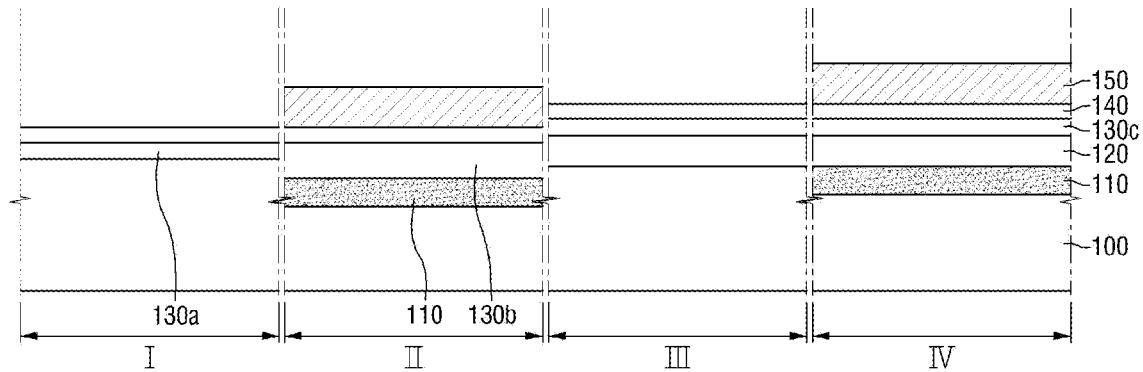

Referring to FIG. 7, a second mask film (not illustrated) is formed on the first work function control material layer 150. The second mask film may include, for example, a silicon nitride film. A second mask pattern is formed by patterning the second mask film. First and third areas I and III of the first work function control material layer 150 are exposed by the second mask pattern. An exposed area of the first work function control material layer 150 is etched using the second mask pattern as an etching mask. Accordingly, the first work function control material layer 150 is formed only on the second and fourth areas II and IV of the substrate 100, but is not formed on the first and third areas I and III of the substrate 100.

An upper surface of the first work function control material layer 150 is exposed by removing the second mask pattern that remains on the first work function control material layer 150.

Figure 8:
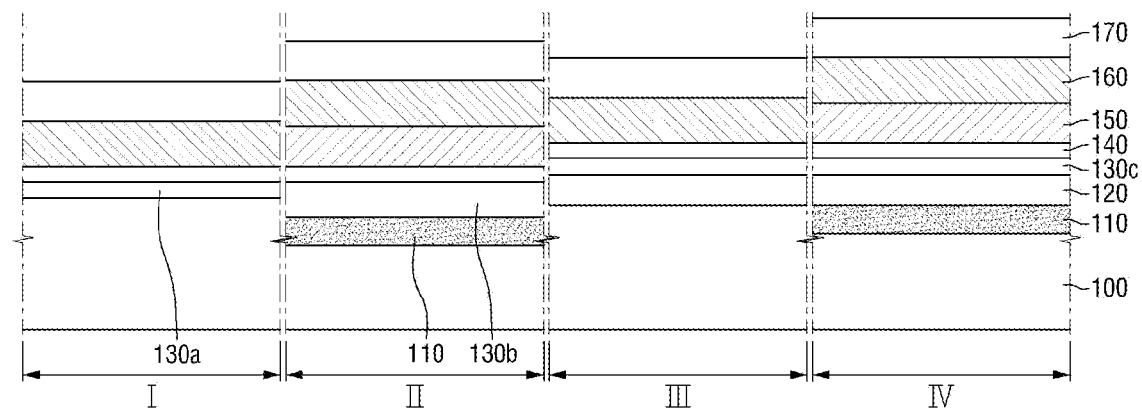

Referring to FIG. 8, a second work function control material layer 160 is conformally formed on the dielectric, i.e., high-k, material layer 140 and the first work function control material layer 150. The second work function control material layer 160 may include, for example, La. More specifically, the second work function control material layer 160 may include a La film, a TiN film, and a poly silicon film, which are sequentially laminated. The second work function control material is not limited to La, but may include at least one of La, Ge, Y, Lu, Sr, and Mg.

A barrier layer 170 may be conformally formed on the second work function control material layer 160. The barrier layer 170 may include, for example, amorphous silicon. The barrier layer 170 serves to prevent or reduce the first work function control material layer 150 and the second work function control material layer 160 from being oxidized in an annealing process 310 to be described later. On the other hand, according to circumstances, the annealing process 310 to be described later may be performed without forming the barrier layer 170 on the second work function control material layer 160.

Figure 9:
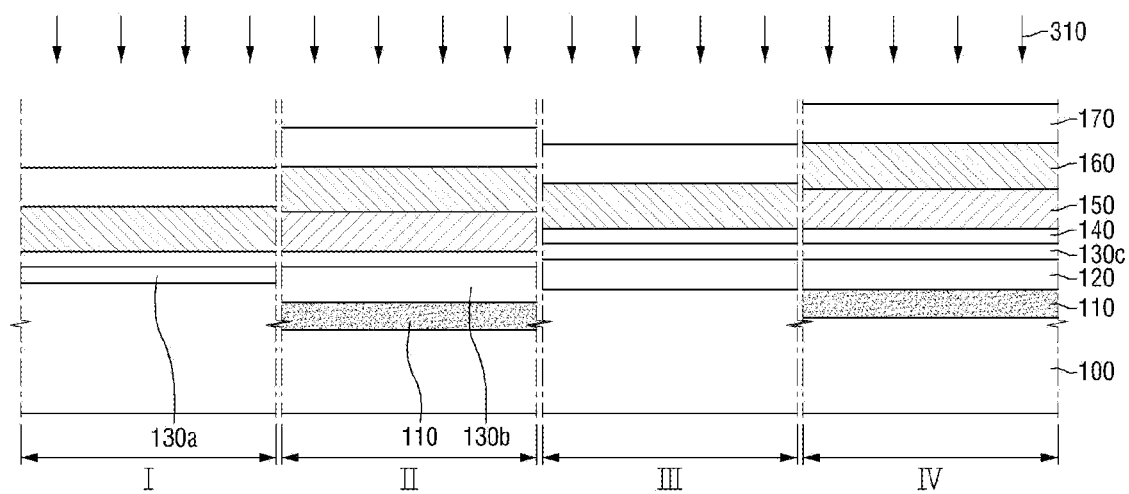

Referring to FIG. 9, the first work function control material and the second work function control material are diffused into the dielectric, i.e., high-k, material layer 140 by performing an annealing process 310. More specifically, the first work function control material Al is diffused into the second area II and the fourth area IV of the dielectric, i.e., high-k, material layer 140, and the second work function control material La is diffused into the first area I and the third area III of the dielectric, i.e., high-k, material layer 140. Here, since La is unable to pass through the first work function control material layer 150, La cannot be diffused into the second area II and the fourth area IV of the dielectric, i.e., high-k, material layer 140. As a result, the first area I and the third area III of the dielectric, i.e., high-k, material layer 140 include LaO, and the second area II and the fourth area IV of the dielectric, i.e., high-k, material layer 140 include AlO.

Figure 10:
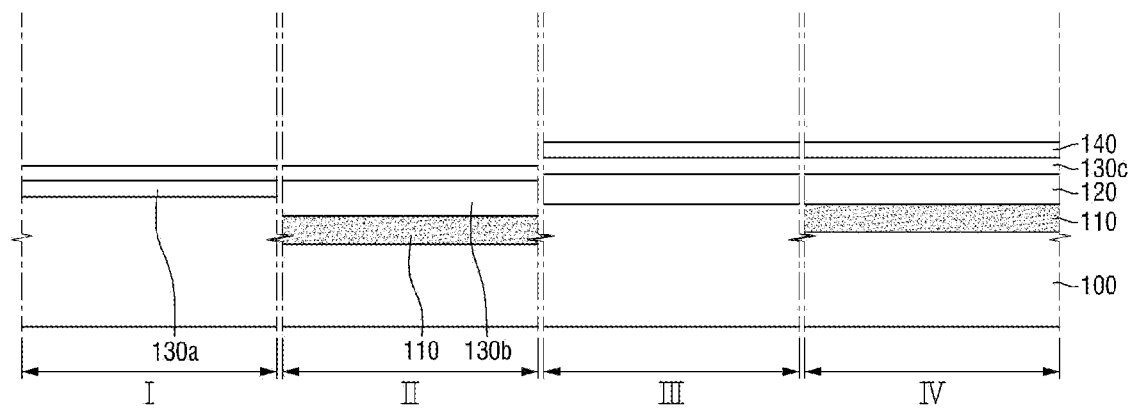

Referring to FIG. 10, an upper surface of the dielectric, i.e., high-k, material layer 140 is exposed by removing the first work function control material layer 150, the second work function material layer 160, and the barrier layer 170, which remain on the dielectric, i.e., high-k, material layer 140.

Figure 11:
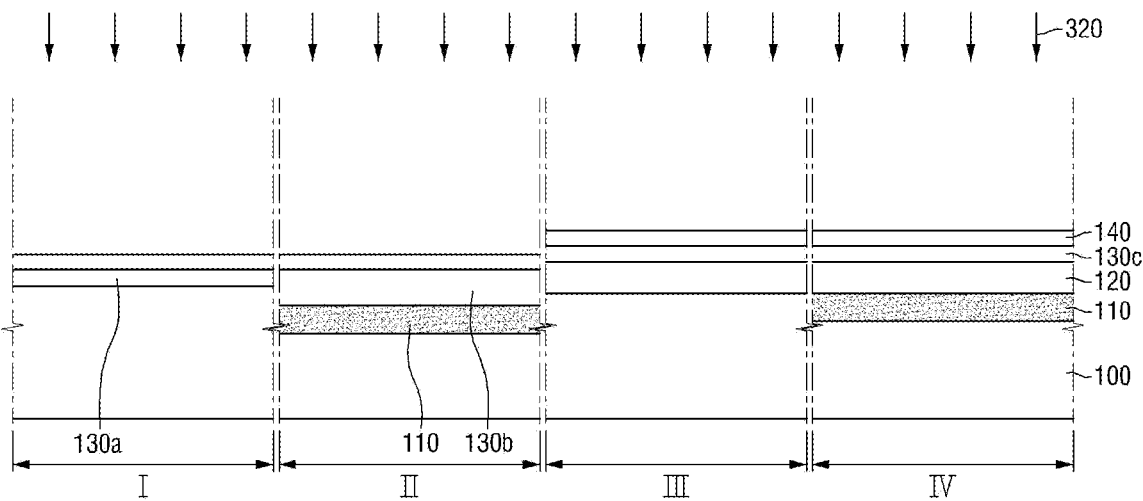

Referring to FIG. 11, the interface material layers 130a, 130b, and 130c are re-grown in the direction of the substrate 100 by performing an oxygen plasma process 320. The oxygen plasma process 320 may be performed at a temperature of about 25° C. to about 500° C. and at a pressure of about 0.01 Torr to about 10 Torr. The oxygen plasma process 320 may be performed using a process gas including at least one of $O_2$, $N_2O$, Ar, and $N_2$. At this time, the dielectric, i.e., high-k, material, into which the work function control material has been diffused, serves to stop the re-growth of the interface material layers 130a, 130b, and 130c. Further, in the oxygen plasma process 320, oxygen vacancy that may occur during a process of removing the first work function control material layer 150 and the second work function control material layer 160 can be recovered. Accordingly, in the semiconductor device according to some example embodiments, the threshold voltage Vt of the PMOS transistor is reduced, and thus the narrow width effect can be improved.

Figure 12:
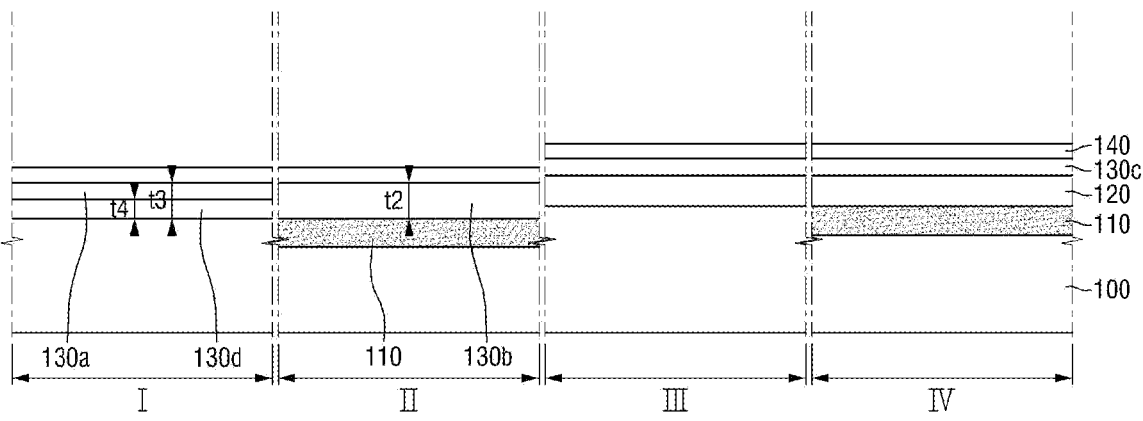

Referring to FIG. 12, a re-growth interface material layer 130d is formed on lower portions of the interface material layers 130a, 130b, and 130c according to the oxygen plasma process 320. The re-growth interface material layer 130d is formed relatively thickly on the lower portion of the interface material layer 130a of the first area I that is relatively thin, and is formed relatively thinly on the lower portion of the interface material layer 130b of the second area II that is relatively thick.

At this time, the re-growth interface material film 130d may not be re-grown on the lower portion of the interface material layer 130b of the second area II. Here, the re-growth is not performed means that the re-growth is performed with a thickness that is thin enough to be disregarded in process. For this, the oxygen plasma process 320 requires a relatively strong oxidization force and must be performed at a relatively low temperature. In substantially the same manner as the interface material layer 130b of the second area II, the re-growth interface material layer 130d is not re-grown even on the lower portion of the interface material layer 130c of the third and fourth areas III and IV.

The re-growth interface material layer 130d may be formed with a fourth thickness t4. The overall thickness t3 of the interface material layers 130a and 130d of the first area I that includes the re-growth interface material layer 130d may be thinner than the second thickness t2, but is not limited thereto. The overall thickness may be variously controlled depending on the performance of the NMOS transistor and the PMOS transistor.

Figure 13:
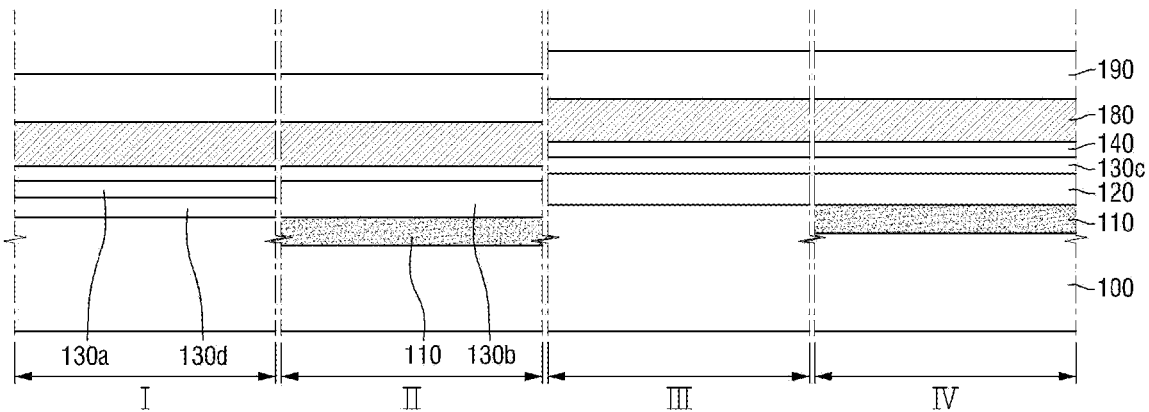

Referring to FIG. 13, a metal layer 180 for forming a metal electrode is conformally formed on the dielectric, i.e., high-k, material layer 140. The metal layer 180 may be made of various materials, and for example, may include TiN. A silicon layer 190 for forming a silicon electrode is conformally formed on the metal layer 180. The silicon layer 190 may include, for example, amorphous silicon or poly silicon.

Referring again to FIG. 2, the silicon layer 190, the metal layer 180, the dielectric, i.e., high-k, material layer 140, the interface material layers 130a, 130b, and 130c, and the insulating material layer 120 are sequentially etched by performing an etching process. At this time, the etching process may use, for example, RIE (Reactive Ion Etching) process. Accordingly, first to fourth gate stacks are formed on the substrate 100.

Here, source/drain areas 201 to 204 of the first to fourth transistors 10 to 40 are formed by injecting impurities onto the active area of the substrate 100. At this time, the respective source/drain areas 201 to 204 may be formed by DDD (Double Diffused Drain) or LDD (Lightly Doped Drain).

Figure 14:
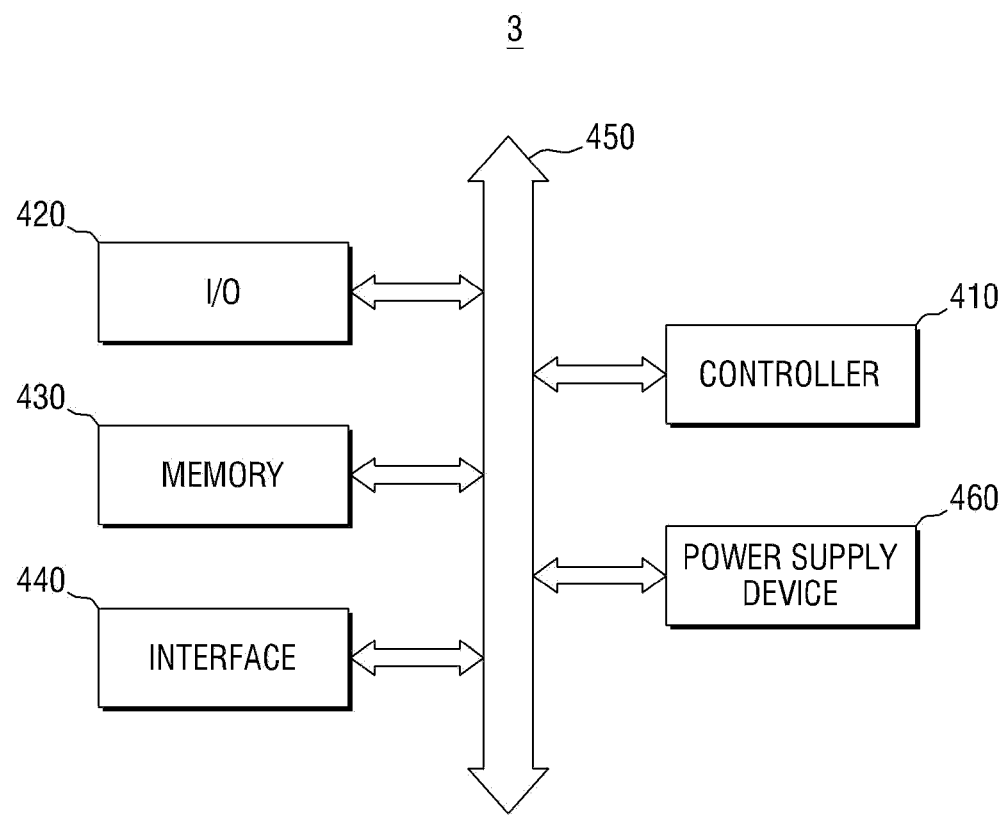
FIG. 14 is a schematic block diagram of an electronic system including a semiconductor device according to some example embodiments.

FIG. 14 is a schematic block diagram of an electronic system including the semiconductor device according to some example embodiments.

Referring to FIG. 14, an electronic system 3 may include a controller 410, an input/output (I/O) device 420, a memory 430, an interface 450, a bus 450 and a power supply device 460. The controller 410, the I/O device 420, the memory 430, the interface 440 and/or the power supply device 460 may be coupled to one another through the bus 450. The bus 450 corresponds to paths through which data is transferred.

The controller 410 may include at least one of a microprocessor, a digital signal processor, a microcontroller, and logic elements that can perform similar functions. The I/O device 420 may include a keypad, a keyboard, and a display device. The memory 430 may store data and/or commands. The interface 440 may function to transfer the data to a communication network or receive the data from the communication network. For example, the interface 440 may include an antenna or a wire/wireless transceiver. Although not illustrated, the electronic system 3 may further include a high-speed DRAM and/or SRAM as an operating memory for improving the operation of the controller 410.

The semiconductor device according to some example embodiments may be provided inside the memory 430 or may be provided to a part of the controller 410 and the I/O device 420.

The electronic system 3 may be applied to a PDA (Personal Digital Assistant), a portable computer, a web tablet, a wireless phone, a mobile phone, a digital music player, a memory card, or all electronic devices that can transmit and/or receive information in wireless environments.

Figure 15:
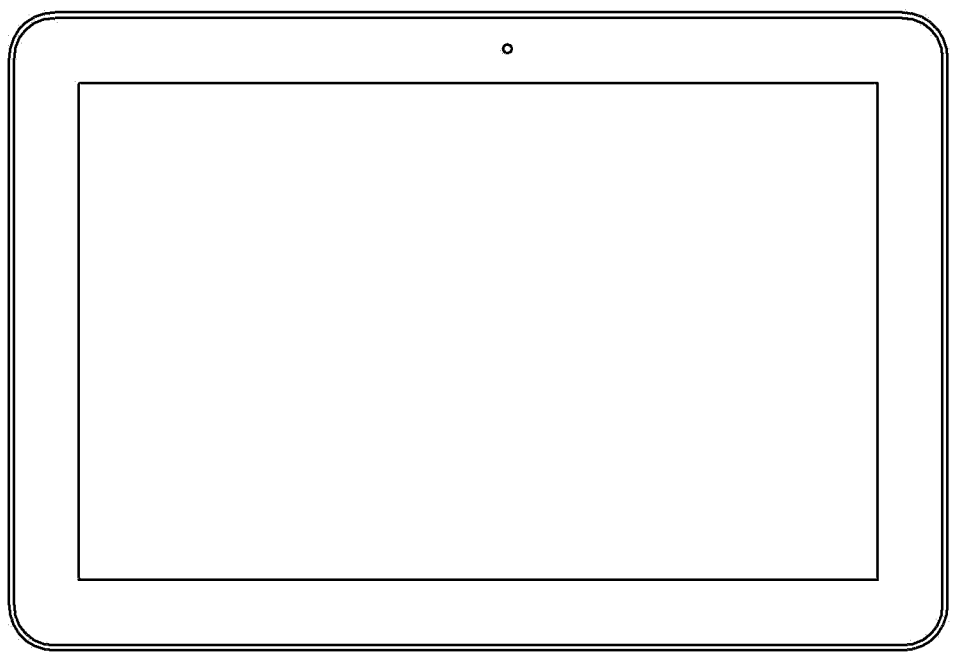
FIGS. 15 and 16 are example views of an electronic system to which the semiconductor device according to some example embodiments can be applied.
Figure 16:
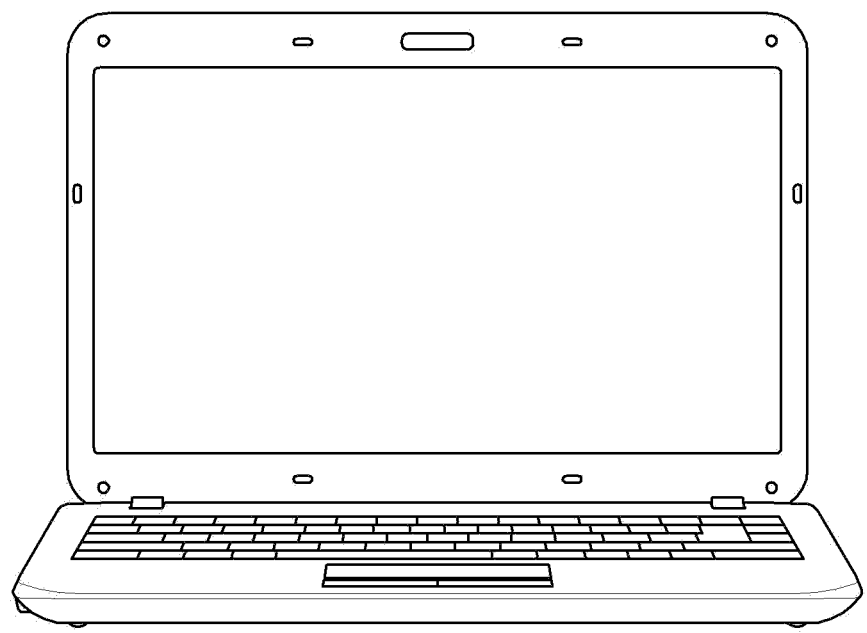

FIGS. 15 and 16 are example views of an electronic system to which the semiconductor device according to some example embodiments can be applied. FIG. 15 illustrates a tablet PC, and FIG. 16 illustrates a notebook PC. It is apparent to those of skilled in the art that the semiconductor device according to some example embodiments can be applied even to other integrated circuit devices that have not been illustrated.

In concluding the detailed description, those skilled in the art will appreciate that many variations and modifications can be made to the example embodiments without substantially departing from the principles of the inventive concepts. Therefore, the disclosed example embodiments are used in a generic and descriptive sense only and not for purposes of limitation.

What is claimed is:

1. A semiconductor device comprising:
   a first interface film on a first area of a substrate, the first interface film including,
      a first growth interface film, and
      a second growth interface film on a lower portion of the first growth interface film;
   a first dielectric film on the first interface film;
   a first gate electrode on the first dielectric film; and
   a second interface film on a second area of the substrate,
   the first growth interface film having a first thickness and the second interface film having a second thickness greater than the first thickness, and
   the second interface film being in the form of a single layer.

2. The semiconductor device of claim 1, wherein the first growth interface film and the second growth interface film include at least one of silicon oxide and silicon oxynitride.

3. The semiconductor device of claim 1, further comprising:
   a second dielectric film on the second interface film; and
   a second gate electrode on the second dielectric film.

4. The semiconductor device of claim 3, wherein the first interface film has a third thickness less than the second thickness of the second interface film.

5. The semiconductor device of claim 3, further comprising:
   a SiGe layer on a lower portion of the second interface film in the substrate.

6. The semiconductor device of claim 3, wherein the first interface film and the second interface film include at least one of silicon oxide and silicon oxynitride.

7. The semiconductor device of claim 1, wherein a dielectric constant of the first dielectric film is greater than a dielectric constant of the first and second growth interface films.

8. The semiconductor device of claim 1, wherein an upper surface of the first interface film is at a same level as an upper surface of the second interface film.

* * * * *